United States Patent
Saito

(10) Patent No.: US 9,287,050 B2
(45) Date of Patent: Mar. 15, 2016

(54) MEMS AND METHOD OF MANUFACTURING THE SAME

(75) Inventor: Tomohiro Saito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 454 days.

(21) Appl. No.: 13/413,889

(22) Filed: Mar. 7, 2012

(65) Prior Publication Data

US 2012/0228726 A1   Sep. 13, 2012

(30) Foreign Application Priority Data

Mar. 11, 2011   (JP) ................................ 2011-054334

(51) Int. Cl.
  *H01L 29/84* (2006.01)
  *H01G 5/18* (2006.01)
  *B81C 1/00* (2006.01)

(52) U.S. Cl.
  CPC .............. *H01G 5/18* (2013.01); *B81C 1/00611* (2013.01); *B81B 2201/018* (2013.01); *B81B 2201/0221* (2013.01); *B81B 2203/0109* (2013.01); *B81C 2201/0126* (2013.01)

(58) Field of Classification Search
  CPC .. H01L 29/84; H01L 21/02; H01L 2924/1461
  USPC ....................................................... 257/415
  See application file for complete search history.

(56) References Cited

U.S. PATENT DOCUMENTS

| 8,445,976 | B2 * | 5/2013 | Yamazaki ...................... 257/415 |
| 2002/0016012 | A1 * | 2/2002 | Kronke et al. ..................... 438/3 |
| 2002/0113281 | A1 * | 8/2002 | Cunningham et al. ......... 257/415 |
| 2007/0176715 | A1 * | 8/2007 | Nakanishi ........................ 335/78 |
| 2010/0213039 | A1 * | 8/2010 | Saito ............................. 200/181 |
| 2011/0062820 | A1 * | 3/2011 | Aoyagi et al. ................. 310/300 |

FOREIGN PATENT DOCUMENTS

| CN | 1966392 A | 5/2007 |
| CN | 101811656 A | 8/2010 |
| EP | 1 343 190 A2 | 9/2003 |
| JP | 10-149951 | 6/1998 |
| JP | 2003-264122 | 9/2003 |
| JP | 2010-199246 | 9/2010 |
| JP | 2011-36948 | 2/2011 |

OTHER PUBLICATIONS

Office Action issued Jul. 2, 2013 in Japanese Patent Application No. 2011-054334 (with English translation).
Chinese Office Action issued Jun. 5, 2014, in China Patent Application No. 201210061957.8 (with English translation).

* cited by examiner

*Primary Examiner* — Thomas L Dickey
(74) *Attorney, Agent, or Firm* — Oblon, McClelland, Maier & Neustadt, L.L.P.

(57) ABSTRACT

According to one embodiment, a MEMS includes a first electrode, a first auxiliary structure and a second electrode. The first electrode is provided on a substrate. The first auxiliary structure is provided on the substrate and adjacent to the first electrode. The first auxiliary structure is in an electrically floating state. The second electrode is provided above the first electrode and the first auxiliary structure, and is driven in a direction of the first electrode.

18 Claims, 13 Drawing Sheets

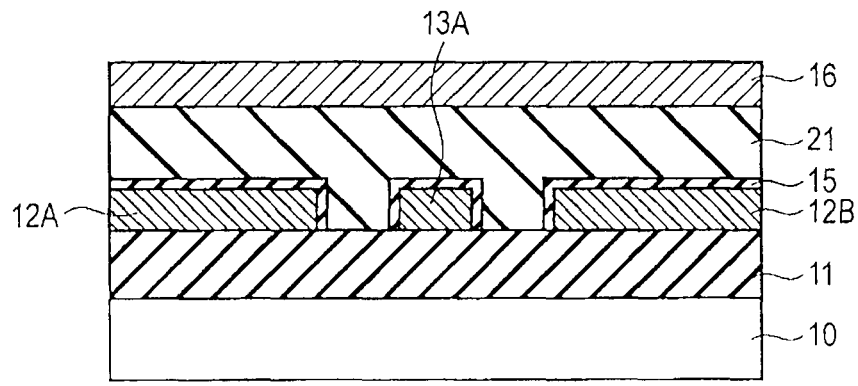
F I G. 3A
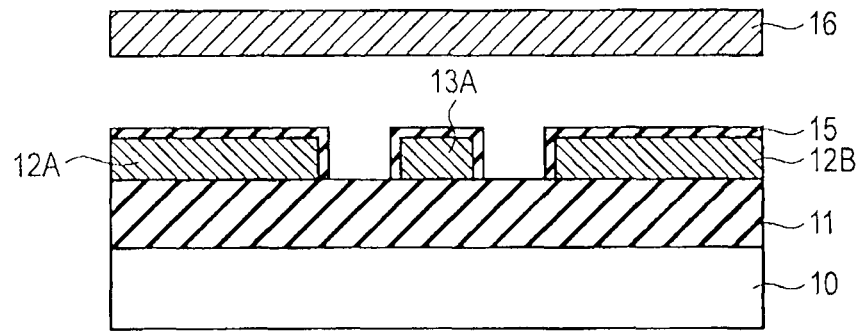
F I G. 3B
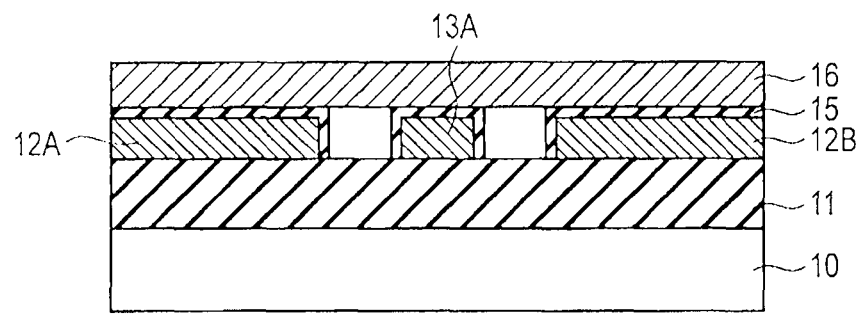
F I G. 3C

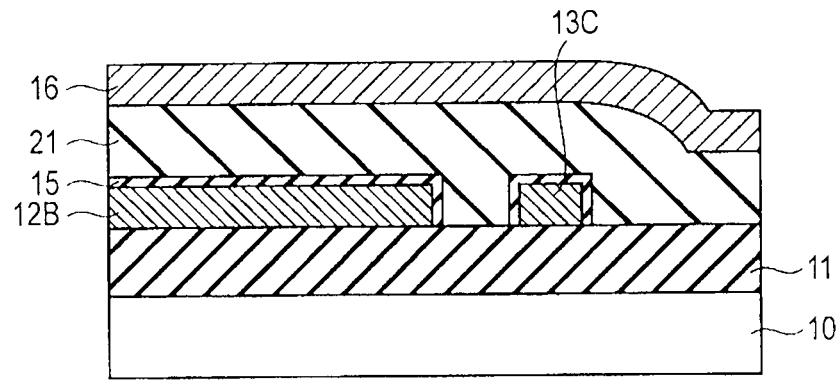
F I G. 4A
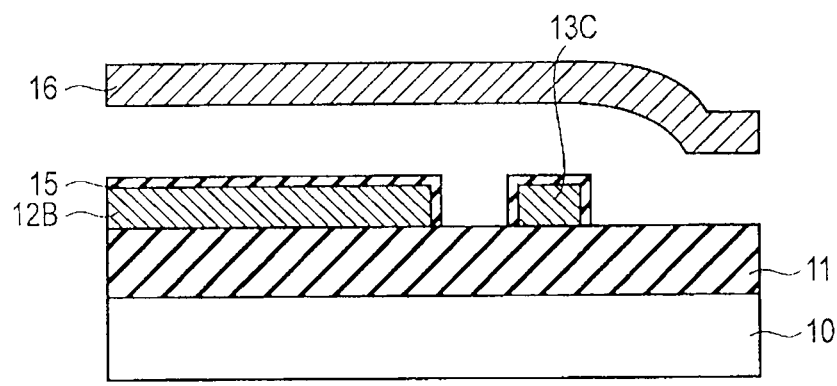
F I G. 4B
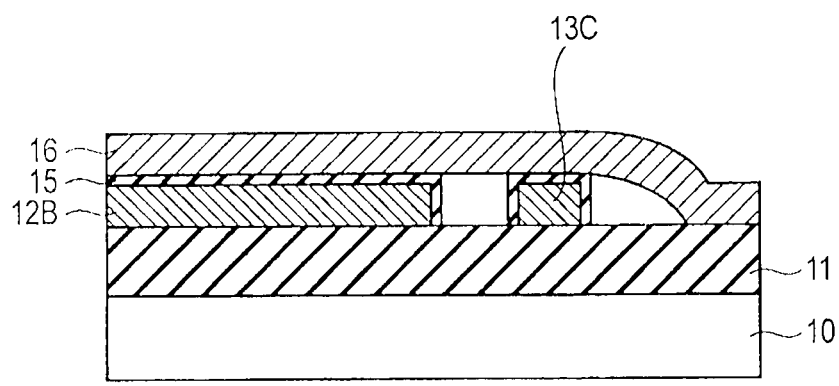
F I G. 4C

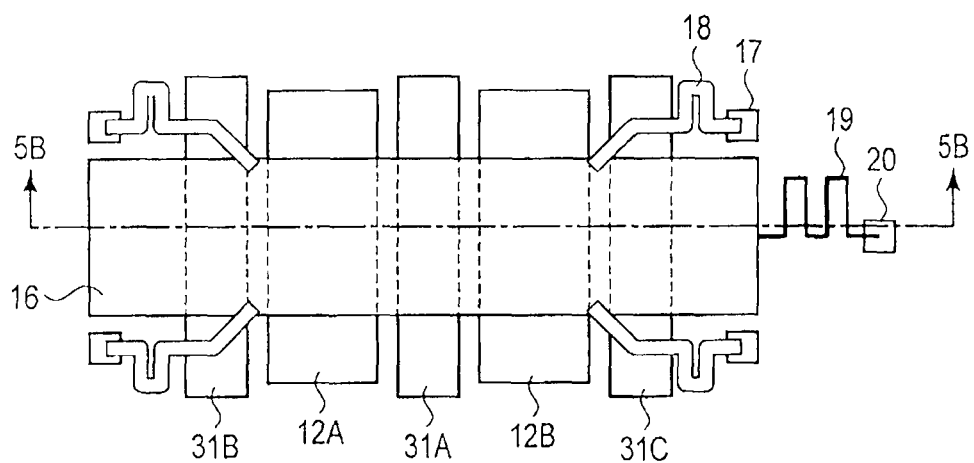
F I G. 5A
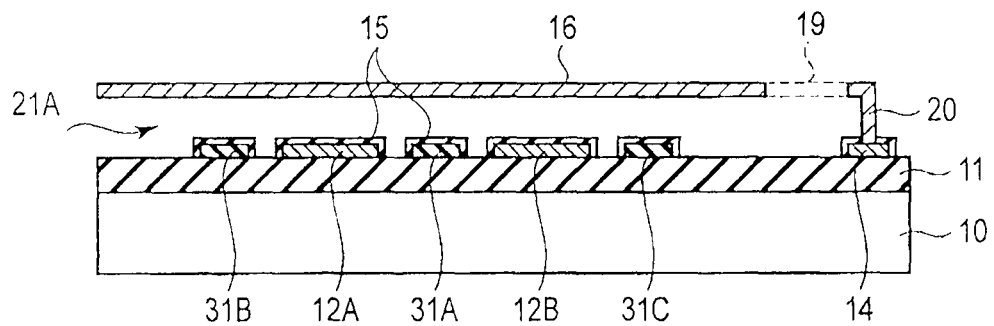
F I G. 5B
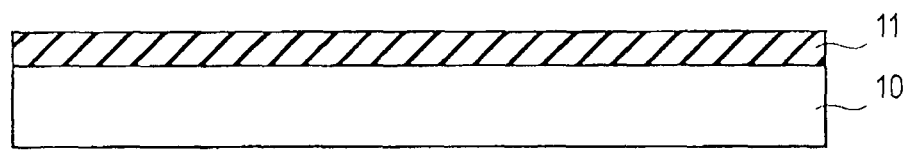
F I G. 6A
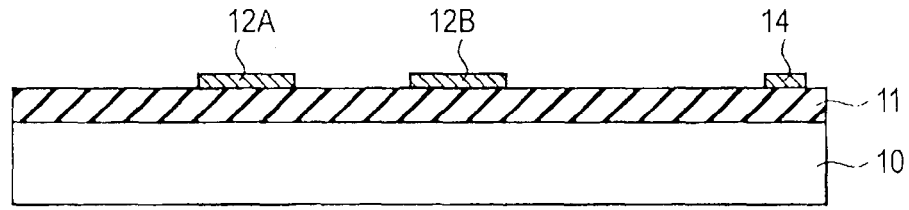
F I G. 6B
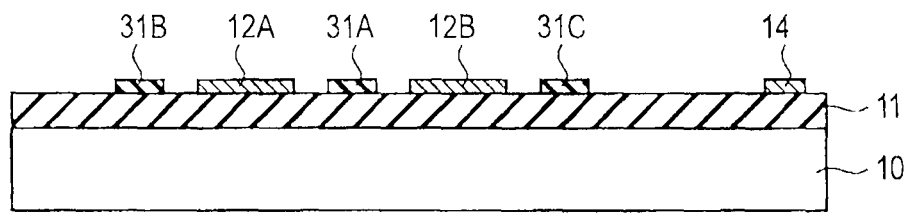
F I G. 6C

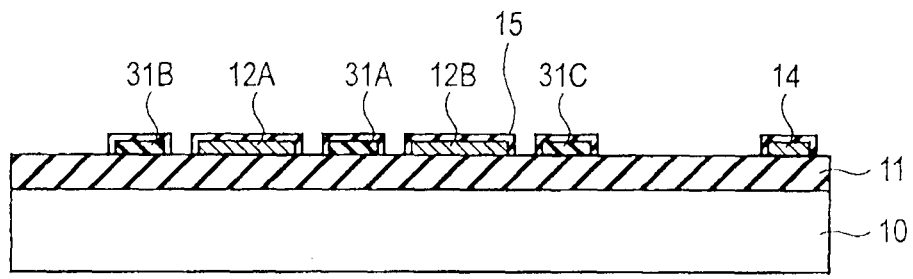
F I G. 7A
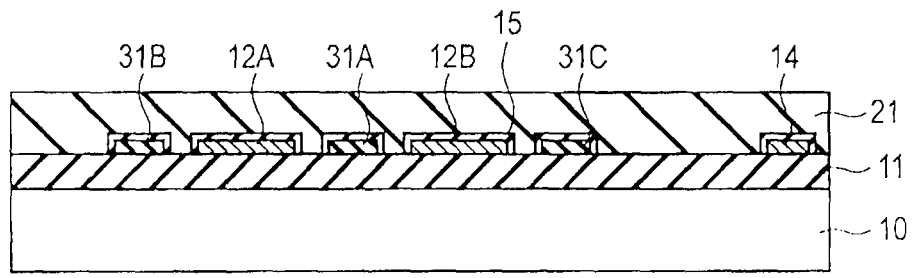
F I G. 7B
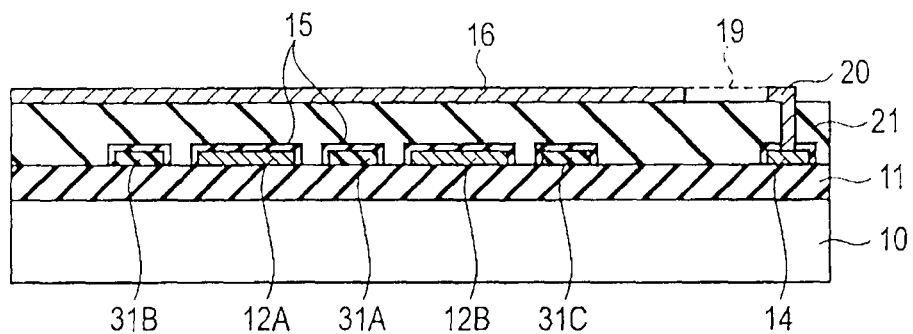
F I G. 7C

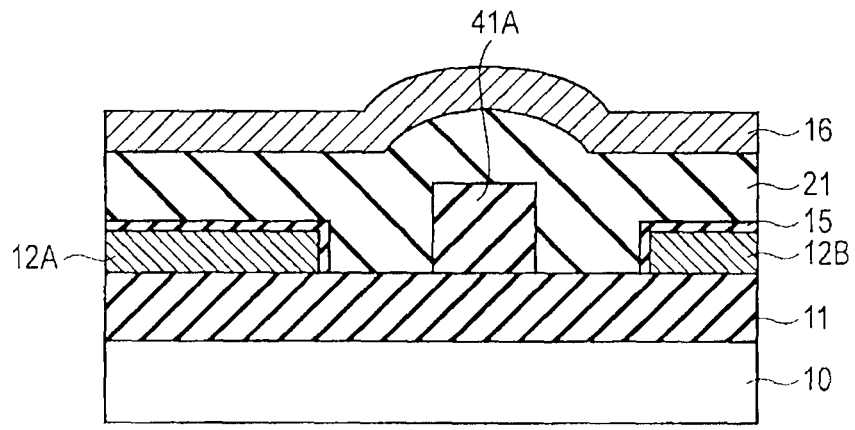
F I G. 11A
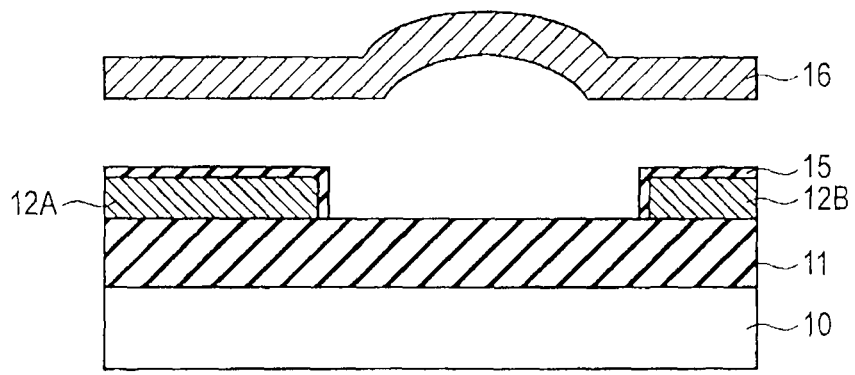
F I G. 11B
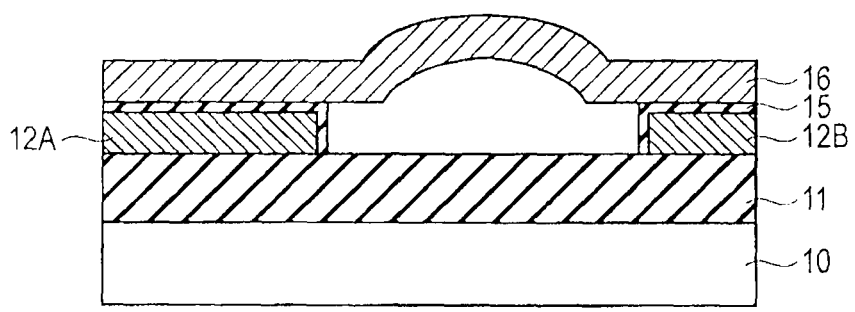
F I G. 11C

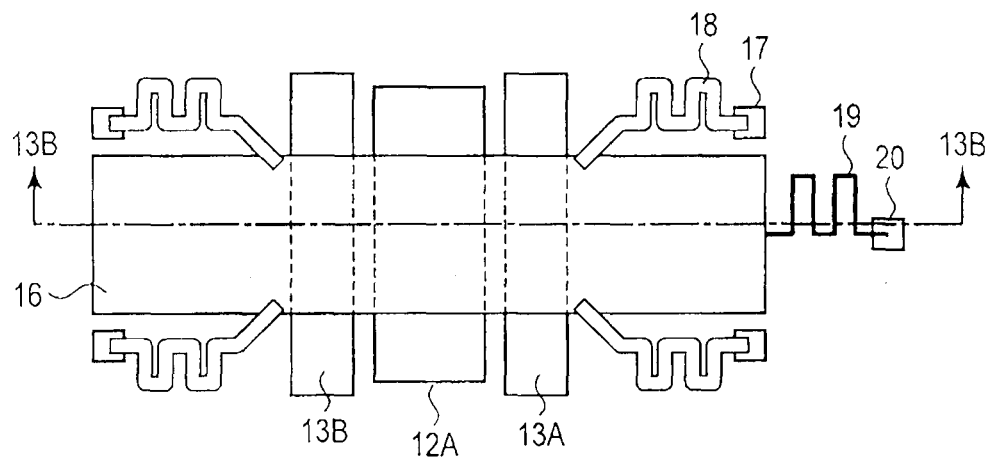
F I G. 13A
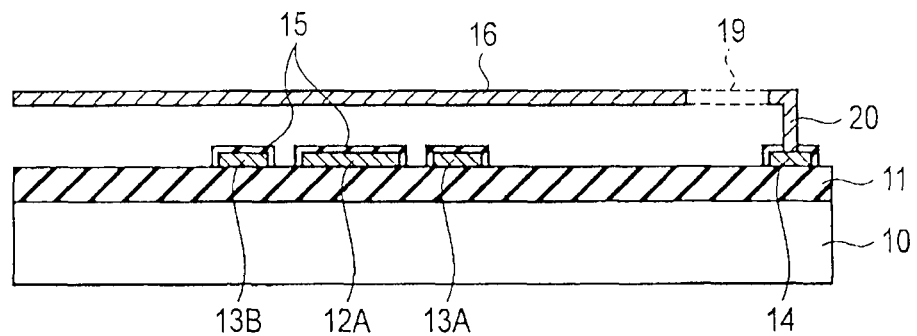
F I G. 13B

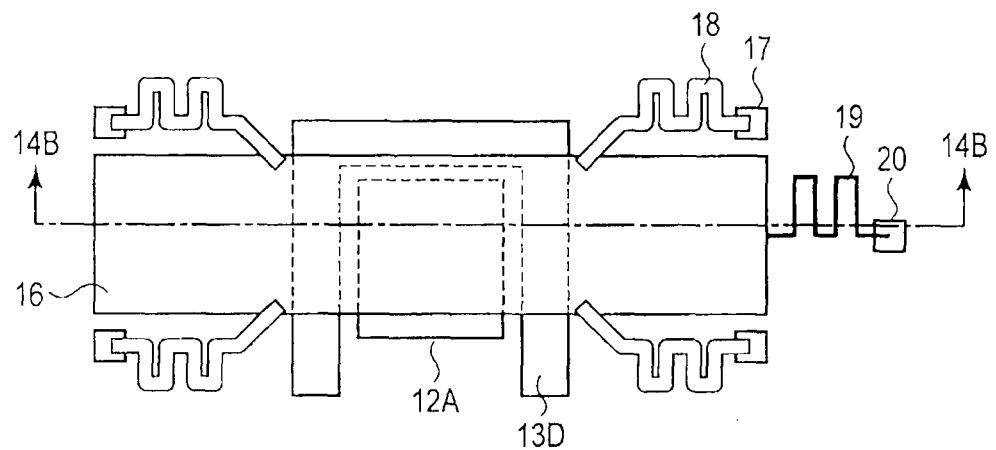
F I G. 14A
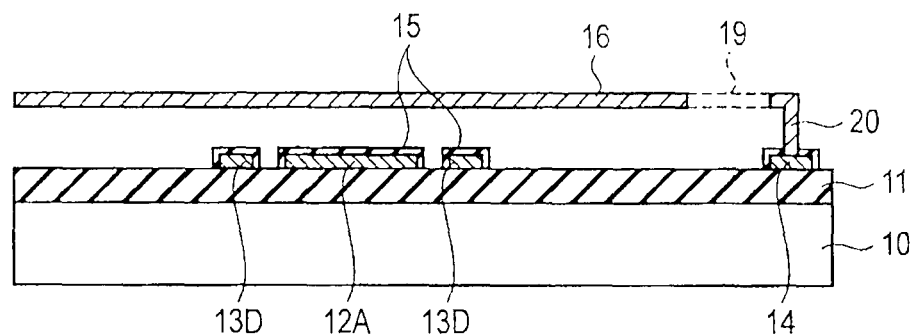
F I G. 14B

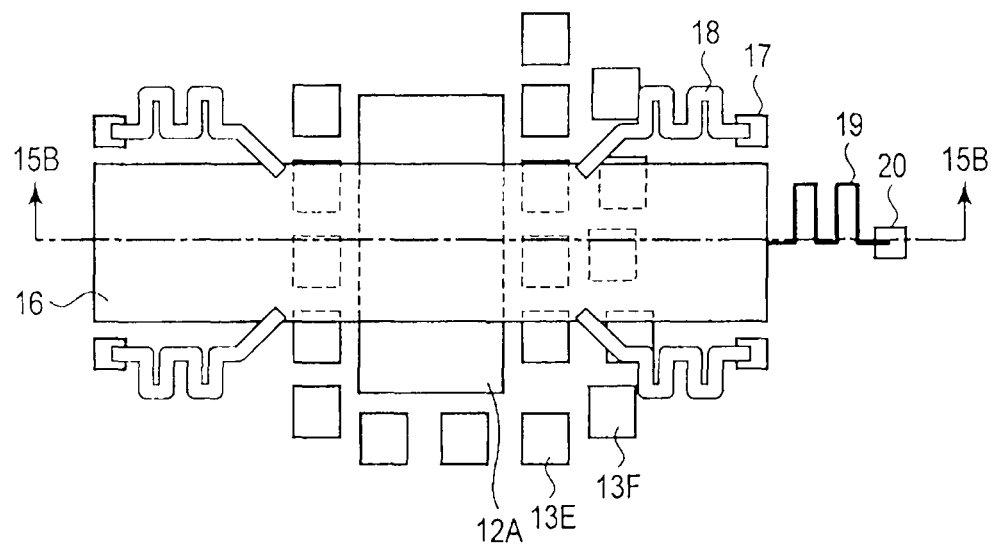
F I G. 15A
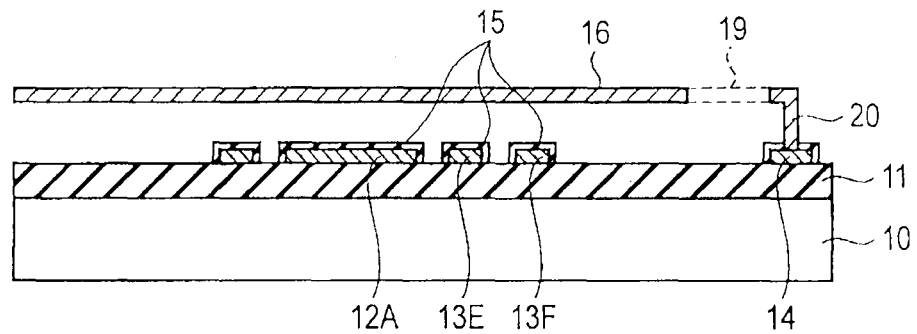
F I G. 15B

MEMS AND METHOD OF MANUFACTURING THE SAME

CROSS-REFERENCE TO RELATED APPLICATIONS

This application is based upon and claims the benefit of priority from prior Japanese Patent Application No. 2011-054334, filed Mar. 11, 2011, the entire contents of which are incorporated herein by reference.

FIELD

Embodiments described herein relate generally to a micro-electro-mechanical system (MEMS) and a method of manufacturing the HEMS.

BACKGROUND

A variable capacitance element using a MEMS (hereinafter, "MEMS capacitor") has a fixed electrode, a movable electrode provided above the fixed electrode and an insulating film provided between the fixed electrode and the movable electrode. The movable electrode is formed on a sacrificial film formed by being coated on the fixed electrode.

In some cases, with the MEMS capacitor adopting this structure, the movable electrode is not formed flat due to concavities and convexities of an underlayer of the sacrificial film, that is, due to the fixed electrode positioned below the sacrificial film. For example, in an area which includes the end of the fixed electrode, coating characteristics of the sacrificial film curves a corresponding movable electrode downward. Hence, when the movable electrode is driven by being applied the voltage, the curved portion of the movable electrode contacts the end of the fixed electrode, and therefore planar portions of the fixed electrode and the movable electrode which occupy a large portion of the capacitor area do not sufficiently attach closely.

As a result, there is a problem that a MEMS capacitor included the movable electrode and the fixed electrode (and the insulating film formed on the fixed electrode) cannot provide a sufficient capacitance. Further, a switch element using the MEMS has a problem that a switching operation becomes unstable. As described above, a device formed using a conventional MEMS has a problem that good element characteristics cannot be obtained.

BRIEF DESCRIPTION OF THE DRAWINGS

FIGS. 3A to 3C are sectional views between a first lower electrode and a second lower electrode of the MEMS according to the first embodiment;

FIGS. 4A to 4C are sectional views near an end of a lower electrode of the MEMS according to the first embodiment;

FIGS. 5A and 5B are a planar view and a sectional view illustrating a structure of a MEMS according to a second embodiment;

FIGS. 6A to 6C are sectional views illustrating a method of manufacturing the MEMS according to the second embodiment;

FIGS. 7A to 7C are sectional views illustrating the method of manufacturing the MEMS according to the second embodiment;

FIGS. 11A to 11C are sectional views between a first lower electrode and a second lower electrode of the MEMS according to a modified example of the third embodiment;

FIGS. 13A and 13B are a planar view and a sectional view illustrating a structure of a MEMS according to a first modified example;

FIGS. 14A and 14B are a planar view and a sectional view illustrating a structure of a MEMS according to a second modified example; and FIGS. 15A and 15B are a planar view and a sectional view illustrating a structure of a MEMS according to a third modified example.

DETAILED DESCRIPTION

Figure 1A:
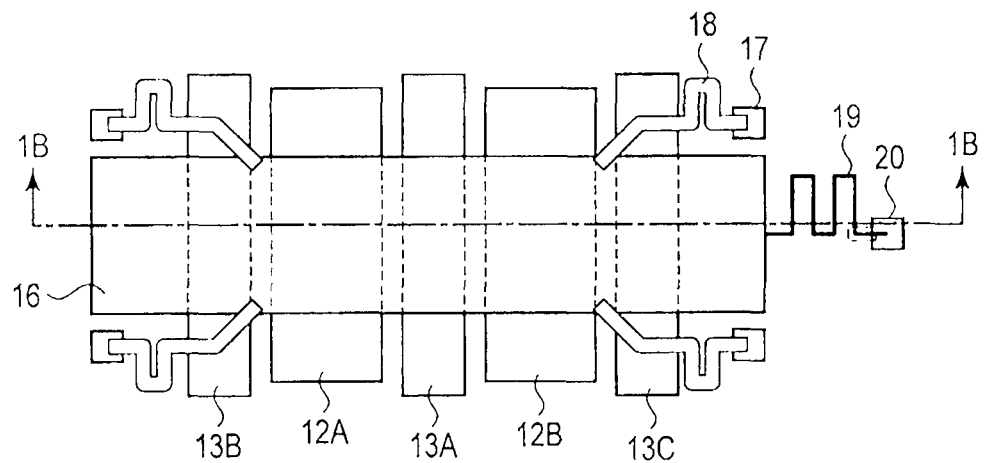
FIGS. 1A and 1B are a planar view and a sectional view illustrating a structure of a MEMS according to a first embodiment.

Hereinafter, a MEMS according to embodiments will be described with reference to the drawings. A variable capacitance element using the MEMS will be described here as an example. In addition, in the following description, components having the same functions and configurations will be assigned the same reference numerals, and overlapping description will be made where necessary.

In general, according to one embodiment, a MEMS includes a first electrode, a first auxiliary structure and a second electrode. The first electrode is provided on a substrate. The first auxiliary structure is provided on the substrate and adjacent to the first electrode. The first auxiliary structure is in an electrically floating state. The second electrode is provided above the first electrode and the first auxiliary structure, and is driven in a direction of the first electrode.

1. First Embodiment

A MEMS according to the first embodiment will be described.

[1] Structure

Figure 1B:
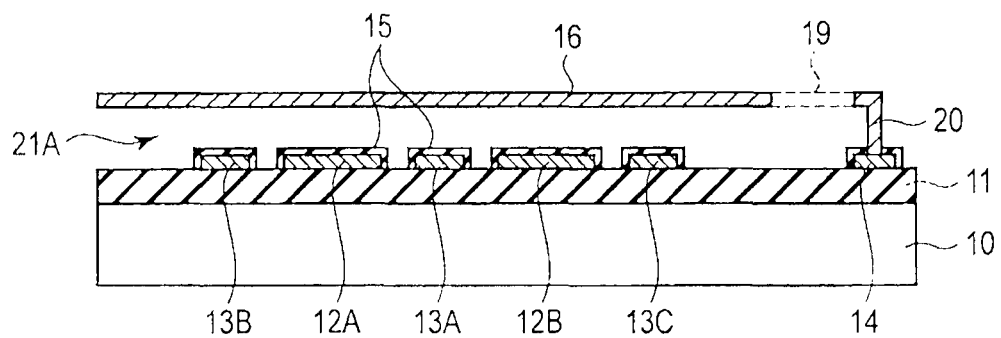

FIG. 1A is a planar view illustrating a structure of the MEMS according to the first embodiment. FIG. 1B is a sectional view along a 1B-1B line in FIG. 1A.

As illustrated in FIG. 1B, an insulating film 11 is formed on a support substrate 10. For example, the support substrate 10 is formed of a silicon semiconductor substrate, and the insulating film 11 is formed of a silicon oxide film.

On the insulating film 11, a first lower electrode 12A, a second lower electrode 12B, a first auxiliary structure 13A, a second auxiliary structure 13B, a third auxiliary structure 13C and an interconnection Layer 14 are formed. The first auxiliary structure 13A is arranged between the first lower electrode 12A and the second lower electrode 12B and adjacent to these electrodes. The second auxiliary structure 13B is arranged adjacent to the first lower electrode 12A such that the first lower electrode 12A is sandwiched between the second auxiliary structure 13B and the first auxiliary structure 13A. The third auxiliary structure 13C is arranged adjacent to the second lower electrode 12B such that the second lower electrode 12B is sandwiched between the third auxiliary structure 13C and the first auxiliary structure 13A.

The first lower electrode 12A and the second lower electrode 12B are fixed electrodes fixed to the support substrate 10, and are signal electrodes, driving electrodes, power source electrodes, or reference voltage (for example, ground voltage) electrodes. The first lower electrode 12A, the second lower electrode 12B and the interconnection layer 14 are made of conductive materials such as aluminum (Al) or tungsten (W).

The first auxiliary structure 13A, the second auxiliary structure 13B and the third auxiliary structure 13C are placed in a floating state where these electrodes are insulated from the first and second lower electrodes 12A and 12B and the interconnection layer 14, and are electrically insulated from other signal, driving, power source or reference voltage electrodes. The first auxiliary structure 13A, the second auxiliary structure 13B and the third auxiliary structure 13C may be made of the same material as the first and second lower electrodes 12A and 12B and the interconnection layer 14 such as aluminum (Al) or tungsten (W), or may be made of a different conductive material.

The insulating films 15 are formed on the first and second lower electrodes 12A and 12B, the first, second and third auxiliary structures 13A, 13B and 13C and the interconnection layer 14. The insulating films 15 are formed of, for example, silicon nitride films.

An upper electrode (movable electrode) 16 is formed above the insulating films 15 on the first and second lower electrodes 12A and 12B and the first, second and third auxiliary structures 13A, 13B and 13C across a cavity 21A.

For example, an electrostatic force produced by the voltage applied between a lower electrode of a driving electrode and the upper electrode 16 drives the upper electrode 16 downward (toward the first and second lower electrodes 12A and 12B). The upper electrode 16 is formed of a conductive film such as aluminum (Al) or tungsten (W). Further, the insulating films 15 are arranged between the first and second lower electrodes 12A and 12B and the upper electrode 16, and function as insulating films for the variable capacitance element.

As illustrated in FIG. 1A, anchors 17 are formed above the insulating film 11, and support beams 18 are fixed to the anchors 17. The upper electrode 16 is held above the first and second lower electrodes 12A and 12B, and the first, second and third auxiliary structures 13A, 13B and 13C by the support beams 18. The upper electrode 16 is electrically connected with the interconnection layer 14 through a connection beam 19, and an anchor 20.

The first, second and third auxiliary structures 13A, 13B and 13C are arranged near an area in which structures including the upper electrode 16, the support beams 18 and the connection beam 19, and the first and second lower electrodes 12A and 12B overlap.

The first and second lower electrodes 12A and 12B, the upper electrode 16 and the insulating films 15 between the lower electrodes 12A and 12B and the upper electrode 16 form the variable capacitance element. When the electrostatic force produced between a lower electrode of a driving electrode and the upper electrode 16 drives the upper electrode 16, the upper electrode 16 descends in a downward direction (toward the lower electrodes), and the upper electrode 16 contacts the insulating films 15 on the lower electrodes 12A and 12B. By this means, it is possible to vary the capacitance of the variable capacitance element.

[2] Manufacturing Method

FIGS. 2A to 2E are sectional views illustrating a method of manufacturing a MEMS according to the first embodiment.

Figure 2A:
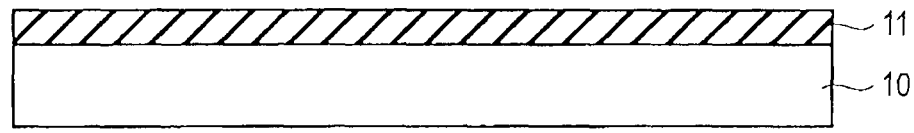
FIGS. 2A to 2E are sectional views illustrating a method of manufacturing the MEMS according to the first embodiment.

As illustrated in FIG. 2A, the insulating film 11 is formed on the support substrate 10 by, for example, chemical vapor deposition (CVD). Further, the insulating film 11 is polished by chemical mechanical polish (CMP) to flatten the upper surface of the insulating film 11.

Figure 2B:
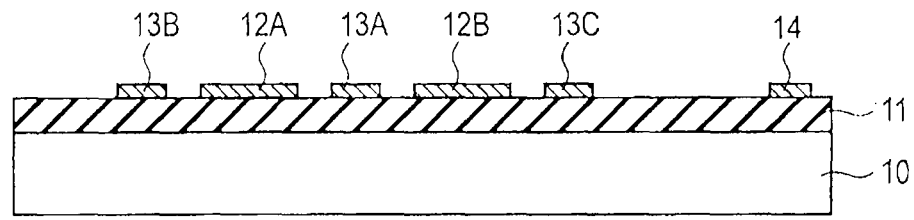

Next, an electrode film is formed on the insulating film 11. Further, as illustrated in FIG. 2B, the electrode film is patterned by a lithography method to form the first lower electrode 12A, the second lower electrode 12B, the first auxiliary structure 13A, the second auxiliary structure 13B, the third auxiliary structure 13C and the interconnection layer 14 on the insulating film 11. The first auxiliary structure 13A, the second auxiliary structure 13B and the auxiliary structure 13C are formed in an electrically insulated floating state such that these structures which are signal electrodes or driving electrodes cause an interference.

Subsequently, on the structure illustrated in FIG. 2B, that is, on the first and second lower electrodes 12A and 12B, on the first, second and third auxiliary structures 13A, 13B and 13C, and on the insulating film 11, the insulating films 15 are formed by CVD. Further, as illustrated in FIG. 2C, the insulating films 15 are patterned by the lithography method to form the insulating film 15 on the first and second lower electrodes 12A and 12B, the first, second and third auxiliary structures 13A, 13B and 130 and the interconnection layer 14.

Figure 2C:
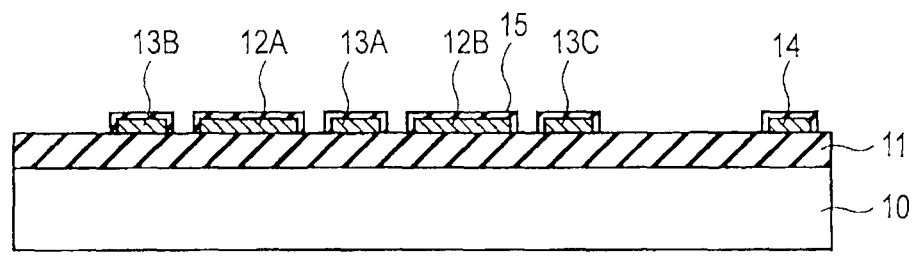
Figure 2D:
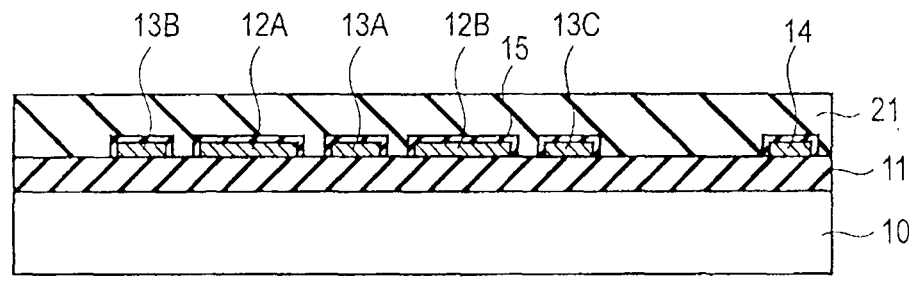

Next, as illustrated in FIG. 2D, on the structure illustrated in FIG. 2C, that is, on the insulating films 11 and 15, a sacrificial film 21 is formed. Meanwhile, the first auxiliary structure 13A is formed between the first lower electrode 12A and the second lower electrode 12B, and the second and third auxiliary structures 13B and 13C are respectively formed adjacent to ends of the first and second lower electrodes 12A and 12B, so that the sacrificial film 21 formed on the insulating films 11 and 15 is flattened. That is, structures are formed such that the upper surface of the sacrificial film 21 is flat. In other words, the auxiliary structures 13A, 13B and 13C are arranged around lower electrodes such that the upper surface of the sacrificial film 21 formed on the substrate 10 including the lower electrodes and the auxiliary structures is sufficiently flat. Further, the sacrificial film 21 is patterned by the lithography method, and contact holes are formed in the sacrificial film 21 on the interconnection layer 14. The sacrificial film 21 is formed of, for example, a polyimide film, a silicon nitride film or a silicon oxide film.

Further, the auxiliary structures 13A, 13B and 13C are arranged near an area in which the upper electrode 16 and the lower electrodes 12A and 12B overlap. Furthermore, the auxiliary structures are arranged such that the upper surface of the sacrificial film 21 formed on the lower electrodes is flat even at a portion at which there is no upper electrode 16.

Figure 2E:
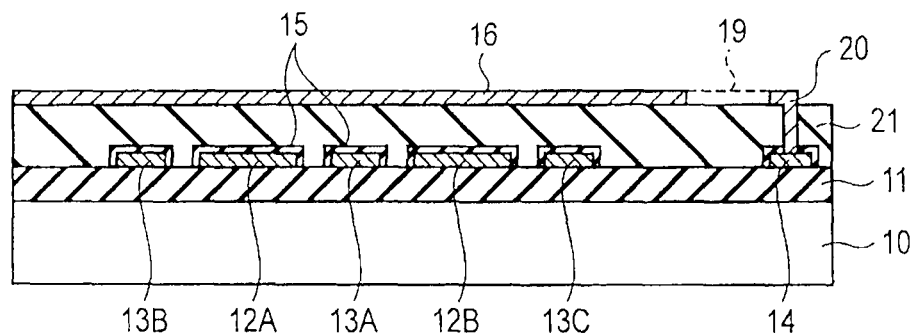

Subsequently, the electrode film 16 which serves as the upper electrode is formed on the sacrificial film 21 by CVD. Further, the electrode film 16 is patterned by the lithography method to form the upper electrode 16 as illustrated in FIG. 2E. Furthermore, anchors (contact plugs) 17 and 20 are formed in contact holes on the interconnection layer 14.

Next, as illustrated in FIG. 1A, the support beams 18 and the connection beam 19 are formed on the sacrificial film 21. The support beams 18 are connected to the anchors 17 and the upper electrode 16 to support the upper electrode 16. The connection beam 19 is connected to the upper electrode 16 and the anchor 20. By this means, the upper electrode 16 is electrically connected to the interconnection layer 14 through the connection beam 19 and the anchor 20. In addition, the support beams 18 or the connection beam 19 can also be formed in the same process as the upper electrode 16.

Subsequently, the sacrificial film 21 is removed in the structure illustrated in FIG. 2E. By this means, as illustrated in FIG. 1B, the cavity 21A is formed between the lower electrodes 12A and 12B and the upper electrode 16, and the MEMS with the upper electrode 16 supported is formed in the cavity 21A.

[3] Structures between Lower Electrodes and Near Ends of Lower Electrodes

Next, an effect will be described in a case where structures between lower electrodes and near ends of the lower electrodes, and auxiliary structures are formed.

First, the structure between the lower electrodes 12A and 12B will be described.

FIGS. 3A, 3B and 3C are views illustrating a sectional structure between the first lower electrode 12A and the second lower electrode 12B of the MEMS. FIG. 3A illustrates a cross section after the sacrificial film 21 and the upper electrode 16 are formed on the lower electrodes 12A and 12B and on the first auxiliary structure 13A. FIG. 3B illustrates a cross section after the sacrificial film 21 is removed. FIG. 3C illustrates a cross section when the upper electrode 16 is driven, and the upper electrode 16 contacts the insulating films 15 on the first and second lower electrodes 12A and 12B.

As illustrated in FIG. 3A, the sacrificial film 21 is formed on the first lower electrode 12A, on the first auxiliary structure 13A and on the second lower electrode 12B, and, moreover, the upper electrode 16 is formed on the sacrificial film 21.

Meanwhile, the first auxiliary structure 13A is provided between the first lower electrode 12A and the second lower electrode 12B. The upper surface of the first auxiliary structure 13A and the upper surfaces of the first and second lower electrodes 12A and 12B are formed at the same height as the insulating film 11 (or the substrate 10). Hence, the sacrificial film 21 between the first lower electrode 12A and the second lower electrode 12B is flattened without being dented. That is, the upper surface of the sacrificial film 21 is formed flat. Consequently, the upper electrode 16 formed on this sacrificial film 21 is flattened without being dented downward (toward the substrate 10). That is, the lower surface of the upper electrode 16 between the first lower electrode 12A and the second lower electrode 12B is formed flat without descending toward the substrate 10.

When the sacrificial film 21 is removed in the MEMS adopting the structure illustrated in FIG. 3A, the upper electrode 16 is kept flat without being dented toward the substrate 10 as illustrated in FIG. 3B.

When the upper electrode 16 of the MEMS adopting the structure illustrated in FIG. 3B is driven, the upper electrode 16 descends toward the lower electrodes 12A and 12B, and the upper electrode 16 contacts the insulating films 15 on the lower electrodes 12A and 12B as illustrated in FIG. 3C. In this case, the upper electrode 16 between the first lower electrode 12A and the second lower electrode 12B is not dented or curved toward the substrate 10 (toward the lower electrodes), so that the upper electrode 16 does not include a curved portion, a problem does not occur that the curved portion contacts the end of the lower electrode 12A (or 12B), and a gap is not produced between the insulating films 15 on the lower electrodes 12A and 12B and the upper electrode 16. Consequently, when the upper electrode is driven toward the lower electrodes in the MEMS capacitor, an unnecessary gap is not produced between the upper electrode and the lower electrodes, so that it is possible to secure a sufficient capacitance.

By contrast with this, when the upper electrode 16 is dented toward the substrate 10, it is possible to prevent the curved portion of the upper electrode 16 from contacting the end portions of the lower electrodes and a flat portion of the upper electrode 16 opposing to the lower electrodes, from contacting the insulating film 15 on the lower electrodes. This produces a cavity between the insulating films 15 on the lower electrodes and the upper electrode 16. As a result, a problem occurs that a substantial film thickness of the insulating films between the lower electrodes 12A and 12B and the upper electrode 16 forming the MEMS capacitor increases. According to the first embodiment, it is possible to reduce these problems.

Further, as described above, the upper electrode 16 does not include the curved portion, and the curved portion of the upper electrode 16 does not contact the end portions of the lower electrodes, and serve as a pivot and prevent the upper electrode 16 from being driven. Consequently, problems do not occur that a high voltage is required to sufficiently attach closely the upper electrode 16 and the lower electrodes, that is, sufficiently saturate the capacitance, and that, when the voltage to be applied between the upper electrode and the lower electrodes is increased, a contact portion serves as a pivot and changes a cavity between the upper and lower electrodes.

Next, the structure near the lower electrode 12B will be described.

FIGS. 4A, 4B and 4C are views illustrating a sectional structure near the end of the second lower electrode 12B of the MEMS. FIG. 4A illustrates a cross section after the sacrificial film 21 and the upper electrode 16 are formed on the second lower electrode 12B and the third auxiliary structure 13C. FIG. 4B illustrates a cross section after the sacrificial film 21 is removed. FIG. 4C illustrates a cross section when the upper electrode 16 is driven, and the upper electrode 16 contacts the insulating films 15 on the second lower electrode 12B.

As illustrated in FIG. 4A, the sacrificial film 21 is formed on the second lower electrode 12B and the third auxiliary structure 13C, and, moreover, the upper electrode 16 is formed on the sacrificial film 21.

Meanwhile, in the surrounding of the second lower electrode 12B, the third auxiliary structure 13C is provided adjacent to the second lower electrode 12B. The upper surface of the third auxiliary structure 13C and the upper surface of the second lower electrode 12B are formed at the same height as the insulating film 11 (or the substrate 10). Hence, the sacrificial film 21 above the vicinity of the second lower electrode 12B is flattened without being dented. That is, the upper surface of the sacrificial film 21 is formed flat. Consequently, the upper electrode 16 formed on this sacrificial film 21 is flattened without being dented downward (toward the substrate 10). That is, the lower surface of the upper electrode 16 formed near the end of the second lower electrode 12B is formed flat without descending toward the substrate 10.

When the sacrificial film 21 is removed in the MEMS adopting the structure illustrated in FIG. 4A, the upper electrode 16 near the end of the second lower electrode 12B is kept flat without being dented toward the substrate 10 as illustrated in FIG. 4B.

When the upper electrode 16 of the MEMS adopting the structure illustrated in FIG. 4B is driven, the upper electrode 16 descends toward the lower electrode 12B and the upper electrode 16 contacts the insulating films 15 on the lower electrode 12B as illustrated in FIG. 4C. In this case, the upper electrode 16 near the end of the second lower electrode 12B is not dented or curved toward the substrate 10 (toward the lower electrodes), so that a problem does not occur that the upper electrode 16 does not include the curved portion and the curved portion contacts the end of the lower electrode 12B. Hence, no cavity is produced between the insulating film 15 on the lower electrode 12B and the upper electrode 16. Consequently, when the upper electrode in the MEMS capacitor is driven toward the lower electrodes, an unnecessary cavity is not produced between the upper electrode and the lower electrodes, so that it is possible to secure a sufficient capacitance. The other effects are the same as the above-described effect between the lower electrodes 12A and 12B.

2. Second Embodiment

A MEMS according to the second embodiment will be described. Although auxiliary structures are formed using the same electrode material as lower electrodes with the first embodiment, auxiliary structures are formed of insulating films with the second embodiment.

[1] Structure

FIG. 5A is a planar view illustrating a configuration of the MEMS according to the second embodiment. FIG. 5B is a sectional view along a 5B-5B line in FIG. 5A.

As illustrated in FIG. 5B, a first lower electrode 12A, a second lower electrode 12B, a first auxiliary structure 31A, a second auxiliary structure 31B, a third auxiliary structure 31C and an interconnection layer 14 are formed on an insulating film 11 on a support substrate 10. The first auxiliary structure 31A is arranged between the first lower electrode 12A and the second lower electrode 12B and adjacent to these electrodes. The second auxiliary structure 31B is arranged adjacent to the first lower electrode 12A such that the first lower electrode 12A is sandwiched between the second auxiliary structure 31B and the first auxiliary structure 31A. The third auxiliary structure 31C is arranged adjacent to the second lower electrode 12B such that the second lower electrode 12B is sandwiched between the third auxiliary structure 31C and the first auxiliary structure 31A.

The lower electrodes 12A and 12B are fixed electrodes fixed to the support substrate 10, and are signal electrodes, driving electrodes, power source electrodes, or reference voltage electrodes. The lower electrodes 12A and 12B and the interconnection layer 14 are made of conductive materials such as aluminum (Al) or tungsten (W). The auxiliary structures 31A, 31B and 31C are formed of insulating films such as silicon nitride films or silicon oxide films.

Insulating films 15 are formed on the lower electrodes 12A and 12B, on the auxiliary structures 31A, 31B and 31C, and on the interconnection layer 14. The insulating films 15 are formed of, for example, silicon nitride films.

An upper electrode (movable electrode) 16 is formed above the insulating films 15 of the lower electrodes 12A and 12B and the auxiliary structures 31A, 31B and 31C across a cavity 21A. The upper electrode 16 is formed of a conductive film such as aluminum (Al) or tungsten (W). Further, the insulating films 15 are arranged between the lower electrodes 12A and 12B and the upper electrode 16, and function as insulating films for the variable capacitance element.

As illustrated in FIG. 5A, the upper electrode 16 is held above the lower electrodes 12A and 12B, and the auxiliary structures 31A, 31B and 31C by support beams 18. The upper electrode 16 is electrically connected with the interconnection layer 14 through a connection beam 19, and an anchor 20. The other structures are the same as the first embodiment.

[2] Manufacturing Method

FIGS. 6A to 6C and FIGS. 7A to 7C are sectional views illustrating a method of manufacturing a MEMS according to the second embodiment.

As illustrated in FIG. 6A, the insulating film 11 is formed on the support substrate 10 by, for example, CVD. Further, the insulating film 11 is polished by CMP to flatten the upper surface of the insulating film 11.

Next, an electrode film is formed on the insulating film 11. Further, as illustrated in FIG. 6B, the electrode film is patterned by a lithography method to form the first lower electrode 12A, the second lower electrode 12B and the interconnection layer 14 on the insulating film 11.

Subsequently, on the structure illustrated in FIG. 6B, that is, on the first and second lower electrodes 12A and 12B, on the interconnection layer 14 and on the insulating film 11, insulating films are formed by CVD. Further, as illustrated in FIG. 6C, the insulating films are patterned by the lithography method to form the first, second and third auxiliary structures 31A, 31B and 31C, respectively on the insulating film 11.

Subsequently, on the structure illustrated in FIG. 6C, that is, on the lower electrodes 12A and 12B, on the auxiliary structures 31A, 31B and 31C, on the interconnection layer 14 and on the insulating film 11, the insulating films 15 are formed by CVD. Further, as illustrated in FIG. 7A, the insulating films 15 are patterned by the lithography method to form the insulating films 15 on the lower electrodes 12A and 12B, the auxiliary structures 31A, 31B and 31C and the interconnection layer 11. In addition, the insulating films 15 may be formed before the auxiliary structures 31A, 31B and 31C are formed after the lower electrodes 12A and 12B are formed.

Next, as illustrated in FIG. 7B, on the structure illustrated in FIG. 7A, that is, on the insulating films 11 and 15, a sacrificial film 21 is formed. Meanwhile, the first auxiliary structure 31A is formed between the first lower electrode 12A and the second lower electrode 12B, and the auxiliary structures 31B and 31C are respectively formed adjacent to ends of the lower electrodes 12A and 12B, so that a sacrificial film 21 formed on the insulating films 11 and 15 is flattened. That is, structures are formed such that the upper surface of the sacrificial film 21 is flat. In other words, the auxiliary structures 31A, 31B and 31C are arranged around lower electrodes such that the upper surface of the sacrificial film 21 formed on the substrate 10 including the lower electrodes and the auxiliary structures is sufficiently flat.

Further, the sacrificial film 21 is patterned by the lithography method, and contact holes are formed in the sacrificial film 21 on the interconnection layer 14. The sacrificial film 21 is formed of, for example, a polyimide film, a silicon nitride film or a silicon oxide film.

Subsequently, the electrode film 16 which serves as the upper electrode is formed on the sacrificial film 21 by CVD. Further, the electrode film 16 is patterned by the lithography method to form the upper electrode 16 as illustrated in FIG. 7C. Furthermore, anchors (contact plugs) 17 and 20 are formed in contact holes on the interconnection layer 14.

Next, as illustrated in FIG. 5A, the support beams 18 and the connection beam 19 are formed on the sacrificial film 21. The support beams 18 are connected to the anchors 17 and the upper electrode 16 to support the upper electrode 16. The connection beam 19 is connected to the upper electrode 16 and the anchor 20. By this means, the upper electrode 16 is electrically connected to the interconnection layer 14 through the connection beam 19 and the anchor 20. In addition, the support beams 18 or the connection beam 19 can also be formed in the same process as the upper electrode 16.

Subsequently, the sacrificial film 21 is removed in the structure illustrated in FIG. 7C. By this means, as illustrated in FIG. 5B, the cavity 21A is formed between the lower electrodes 12A and 12B and the upper electrode 16, and the MEMS with the upper electrode 16 supported is formed in the cavity 21A.

[3] Structures Between Lower Electrodes and Near Ends of Lower Electrodes

An effect in a case where structures between lower electrodes and near ends of the lower electrodes, and auxiliary structures are formed is the same as the effect described in the first embodiment.

When the upper electrode 16 of the MEMS adopting the structure illustrated in FIG. 5B is driven, the upper electrode 16 descends toward the lower electrodes 12A and 12B, and the upper electrode 16 contacts the insulating films 15 on the lower electrodes 12A and 12B. In this case, the upper electrode 16 between the first lower electrode 12A and the second lower electrode 12B is not dented or curved toward the substrate 10 (toward the lower electrodes), so that the upper electrode 16 does not include a curved portion, a problem does not occur that the curved portion contacts the end of the lower electrode 12A (or 12B), and a gap is not produced between the insulating films 15 on the lower electrodes 12A and 12B and the upper electrode 16. Consequently, when the upper electrode is driven toward the lower electrodes in the MEMS capacitor, an unnecessary gap is not produced between the upper electrode and the lower electrodes, so that it is possible to secure a sufficient capacitance.

Further, as described above, the upper electrode 16 does not include the curved portion, and the curved portion of the upper electrode 16 does not contact the end portions of the lower electrodes, and serve as a pivot and prevent the upper electrode 16 from being driven. Consequently, problems do not occur that a high voltage is required to sufficiently attach closely the upper electrode 16 and the lower electrodes, that is, sufficiently saturate the capacitance, and that, when the voltage to be applied between the upper electrode and the lower electrodes is increased, a contact portion serves as a pivot and changes a cavity between the upper and lower electrodes.

3. Third Embodiment

A MEMS according to the third embodiment will be described. Although examples have been described with the first and second embodiments where auxiliary structures are left, with the third embodiment, an upper electrode is formed, and then a sacrificial film and auxiliary structures are removed.

[1] Structure

Figure 8A:
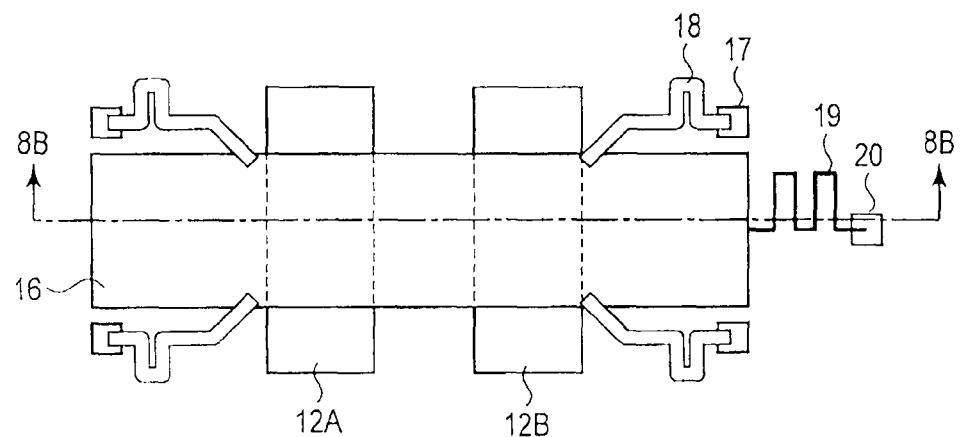
FIGS. 8A and 8B are a planar view and a sectional view illustrating a structure of a MEMS according to a third embodiment.
Figure 8B:
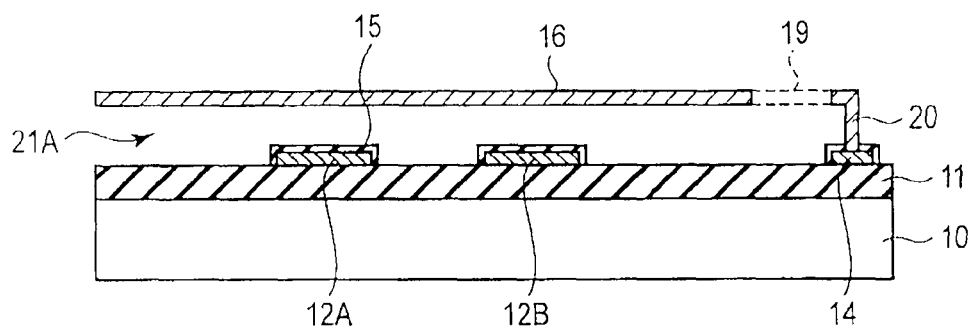

FIG. 8A is a planar view illustrating a configuration of the MEMS according to the third embodiment. FIG. 8B is a sectional view along a 8B-8B line in FIG. 8A.

As illustrated in FIG. 8B, a first lower electrode 12A, a second lower electrode 12B and an interconnection layer 14 are formed on an insulating film 11 on a support substrate 10. The lower electrodes 12A and 12B are fixed electrodes fixed to the support substrate 10, and are signal electrodes, driving electrodes, power source electrodes, or reference voltage electrodes. The lower electrodes 12A and 12B and the interconnection layer 14 are made of conductive materials such as aluminum (Al) or tungsten (W).

Insulating films 15 are formed on the lower electrodes 12A and 12B and the interconnection layer 14. The insulating films 15 are formed of, for example, silicon nitride films.

An upper electrode (movable electrode) 16 is formed above insulating films 15 of the lower electrodes 12A and 12B across a cavity 21A. An upper electrode 16 is formed of a conductive film such as aluminum (Al) or tungsten (W). Further, the insulating films 15 are arranged between the lower electrodes 12A and 12B and the upper electrode 16, and function as insulating films for a variable capacitance element.

As illustrated in FIG. BA, the upper electrode 16 is held above the lower electrodes 12A and 12B by support beams 18. The upper electrode 16 is electrically connected with the interconnection layer 14 through a connection beam 19, and an anchor 20. The other structures are the same as the first embodiment.

[2] Manufacturing Method

FIGS. 9A to 9C and FIGS. 10A to 10C are sectional views illustrating a method of manufacturing a MEMS according to the third embodiment.

Figure 9A:
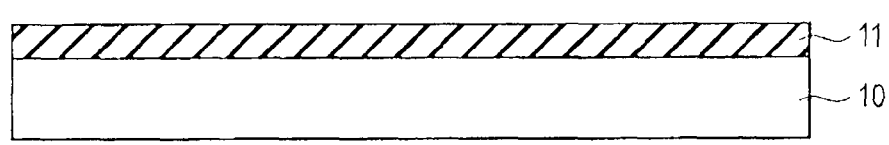
FIGS. 9A to 9C are sectional views illustrating a method of manufacturing the MEMS according to the third embodiment.

As illustrated in FIG. 9A, the insulating film 11 is formed on the support substrate 10 by, for example, CVD. Further, the insulating film 11 is polished by CMP to flatten the upper surface of the insulating film 11.

Figure 9B:
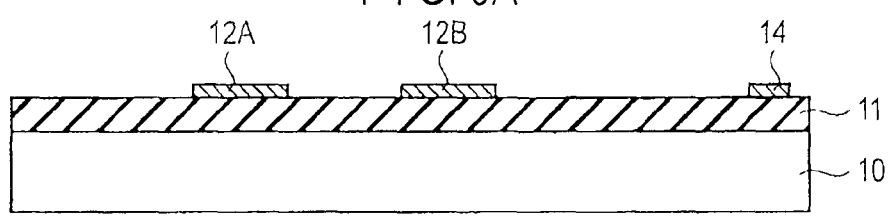

Next, an electrode film is formed on the insulating film 11. Further, as illustrated in FIG. 9B, the electrode film is patterned by a lithography method to form the first lower electrode 12A, the second lower electrode 12B and the interconnection layer 14 on the insulating film 11.

Subsequently, on the structure illustrated in FIG. 9B, that is, on the lower electrodes 12A and 12B, on the interconnection layer 14 and on the insulating film 11, the insulating films 15 are formed by CVD. Further, as illustrated in FIG. 9C, the insulating films 15 are patterned by the lithography method to form the insulating films 15 on the lower electrodes 12A and 12B and the interconnection layer 14.

Figure 9C:
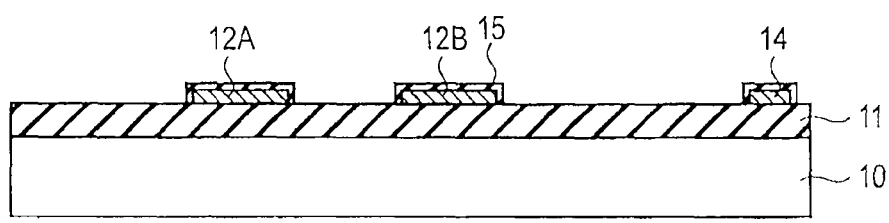
Figure 10A:
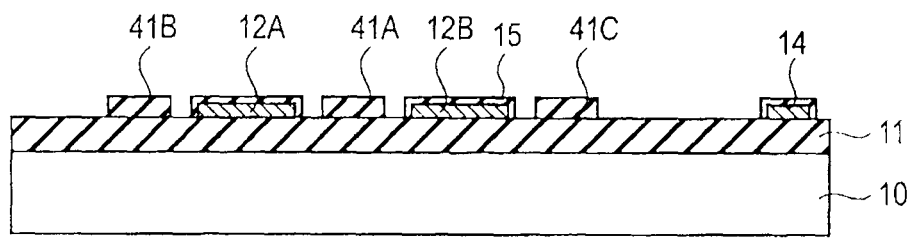
FIGS. 10A to 10C are sectional views illustrating the method of manufacturing the MEMS according to the third embodiment.

Next, on the structure illustrated in FIG. 9C, that is, on the insulating films 11 and 15, insulating films are formed by CVD. Further, as illustrated in FIG. 10A, the insulating films are patterned by the lithography method to form a first auxiliary structure 41A, a second auxiliary structure 41B and a third auxiliary structure 41C, respectively. The auxiliary structures 41A, 41B and 41C are formed of, for example, polyimide films or resist films.

The first auxiliary structure 41A is arranged between the first lower electrode 12A and the second lower electrode 12B and adjacent to these electrodes. The second auxiliary structure 41B is arranged adjacent to the first lower electrode 12A such that the first lower electrode 12A is sandwiched between the second auxiliary structure 41B and the first auxiliary structure 41A. The third auxiliary structure 41C is arranged adjacent to the second lower electrode 12B such that the second lower electrode 12B is sandwiched between the third auxiliary structure 41C and the first auxiliary structure 41A.

Figure 10B:
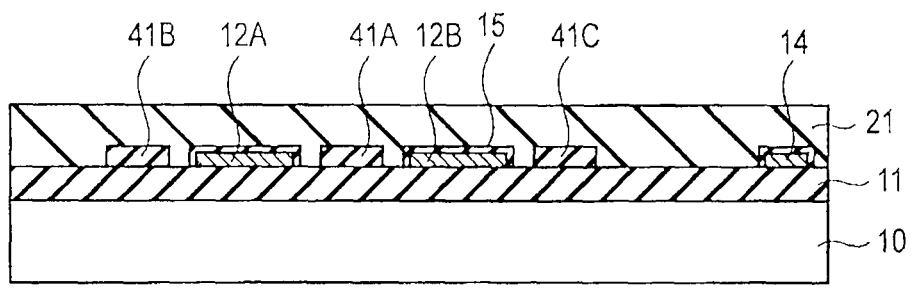

Subsequently, as illustrated in FIG. 10B, on the structure illustrated in FIG. 10A, that is, on the insulating films 11 and 15 and on the auxiliary structures 41A, 41B and 41C, a sacrificial film 21 is formed. Meanwhile, the first auxiliary structure 41A is formed between the first lower electrode 12A and the second lower electrode 12B, and the auxiliary structures 410 and 41C are respectively formed adjacent to ends of the lower electrodes 12A and 12B, so that the sacrificial film 21 formed on the insulating films 11 and 15 and the auxiliary structures 41A, 41B and 41C is flattened. That is, structures are formed such that the upper surface of the sacrificial film 21 is flat. In other words, the auxiliary structures 41A, 41B and 41C are arranged around lower electrodes such that the upper surface of the sacrificial film 21 formed on the substrate 10 including the lower electrodes and the auxiliary structures is sufficiently flat.

Further, the sacrificial film 21 is patterned by the lithography method, and contact holes are formed in the sacrificial film 21 on the interconnection layer 14. The sacrificial film 21 is formed of, for example, a polyimide film or a resist film.

Figure 10C:
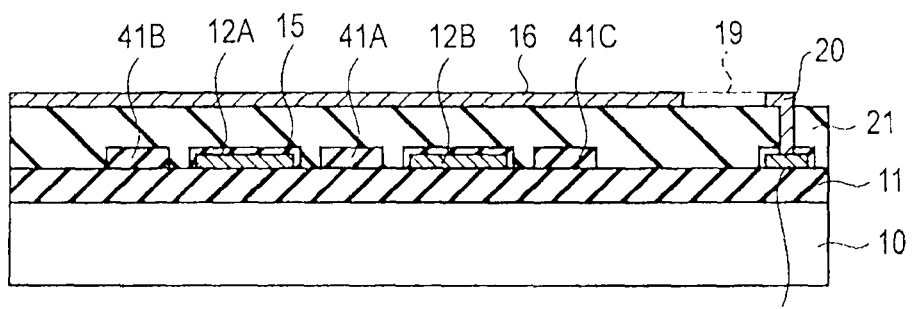

Subsequently, the electrode film 16 which serves as the upper electrode is formed on the sacrificial film 21 by CVD. Further, the electrode film 16 is patterned by the lithography method to form the upper electrode 16 as illustrated in FIG. 10C. Furthermore, anchors (contact plugs) 17 and 20 are formed in contact holes on the interconnection layer 14.

Next, as illustrated in FIG. 8A, the support beams 18 and the connection beam 19 are formed on the sacrificial film 21. The support beams 18 are connected to anchors 17 and the upper electrode 16 to support the upper electrode 16. The connection beam 19 is connected to the upper electrode 16 and the anchor 20. By this means, the upper electrode 16 is electrically connected to the interconnection layer 14 through the connection beam 19 and the anchor 20. In addition, the support beams 18 or the connection beam 19 can also be formed in the same process as the upper electrode 16.

Subsequently, the sacrificial film 21 is removed and the auxiliary structures 41A, 41B and 41C are further removed in the structure illustrated in FIG. 10O. When the sacrificial film and the auxiliary structures are made of the same material such as polyimide films, it is possible to etch the sacrificial film and the auxiliary structures at the same time. Further, when the sacrificial film and the auxiliary structures are formed using different materials, auxiliary structures may be etched by changing, for example, gas etching conditions after the sacrificial film is etched. Further, the auxiliary structures may be partially left. By this means, as illustrated in FIG. 8B, the cavity 21A is formed between the lower electrodes 12A and 12B and the upper electrode 16, and the MEMS with the upper electrode 16 supported is formed in the cavity 21A.

[3] Structures Between Lower Electrodes and Near Ends of Lower Electrodes

An effect in a case where structures between other Lower electrodes and near ends of the lower electrodes, and auxiliary structures are formed is the same as the effect described in the first embodiment except that there are no auxiliary structure.

When the upper electrode 16 of the MEMS adopting the structure illustrated in FIG. 8B is driven, the upper electrode 16 descends toward the lower electrodes 12A and 12B, and the upper electrode 16 contacts the insulating films 15 on the lower electrodes 12A and 12B. In this case, the upper electrode 16 between the first lower electrode 12A and the second lower electrode 12B is not dented or curved toward the substrate 10 (toward the lower electrodes), so that the upper electrode 16 does not include a curved portion, a problem does not occur that the curved portion contacts the end of the lower electrode 12A (or 12B), and a gap is not produced between the insulating films 15 on the lower electrodes 12A and 12B and the upper electrode 16. Consequently, when the upper electrode is driven toward the lower electrodes in the MEMS capacitor, an unnecessary gap is not produced between the upper electrode and the lower electrodes, so that it is possible to secure a sufficient capacitance.

Further, as described above, the upper electrode 16 does not include the curved portion, and the curved portion of the upper electrode 16 does not contact the end portions of the lower electrodes, and serve as a pivot and prevent the upper electrode 16 from being driven. Consequently, problems do not occur that a high voltage is required to sufficiently attach closely the upper electrode 16 and the lower electrodes, that is, sufficiently saturate the capacitance, and that, when the voltage to be applied between the upper electrode and the lower electrodes is increased, a contact portion serves as a pivot and changes a cavity between the upper and lower electrodes.

Although an example has been described with the third embodiment where all of the auxiliary structures 41A, 41B and 41C are removed, each auxiliary structure may be left or removed. For example, the auxiliary structure 41A in the center may be left, and the auxiliary structures 41B and 41C on both sides may be removed. Further, all of the auxiliary structures 41A, 41B and 41C may be left.

Auxiliary structures can be removed if materials of the auxiliary structures have the etching selectivity with respect to a material of the sacrificial film 21, and the auxiliary structures can be removed if materials of the auxiliary structures do not have the etching selectivity.

When the sacrificial film 21 is formed of a polyimide film, if auxiliary structures are formed of polyimide films, the auxiliary structures can also be removed simultaneously in process of removing the sacrificial film 21. By contrast with this, by forming the auxiliary structures using materials which are hardly etched in process of removing the sacrificial film (polyimide film) 21, the auxiliary structures can be left.

Further, the sacrificial film 21 may be formed of a silicon film. When the sacrificial film 21 is formed of a silicon film, if auxiliary structures are formed of silicon films likewise, the auxiliary structures can also be removed at the same time in the process of removing the sacrificial film 21. By contrast with this, by forming the auxiliary structures using materials which are hardly etched in the process of removing the sacrificial film (polyimide film) 21, the auxiliary structures can be left.

Next, a structure between the lower electrodes 12A and 12B and a modified example of its manufacturing method will be described with reference to FIG. 11.

As illustrated in FIG. 10A, when the height of the upper surface of the auxiliary structure 41A is the same height as the upper surfaces of the lower electrodes 12A and 12B, flatness of the upper surface of the sacrificial film 21 cannot be secured in some cases depending on a material of the sacrificial film 21. In this case, with this modified example illustrated in FIG. 11, to secure the flatness of the upper surface of the sacrificial film 21, the height of the upper surface of the auxiliary structure 41A is higher than the height of the upper surfaces of the lower electrodes 12A and 12B.

FIGS. 11A, 11B and 11C are views illustrating a sectional structure between the first lower electrode 12A and the second lower electrode 12B of the MEMS and a method of manufacturing the MEMS. FIG. 11A illustrates a cross section after the sacrificial film 21 and the upper electrode 16 are formed on the lower electrodes 12A and 12B and on the auxiliary structure 41A. FIG. 11B illustrates a cross section after the sacrificial film 21 and the auxiliary structure 41A are removed. FIG. 11C illustrates a cross section when the upper electrode 16 is driven, and the upper electrode 16 contacts the insulating films 15 on the first and second lower electrodes 12A and 12B.

As illustrated in FIG. 11A, the sacrificial film 21 is formed on the first lower electrode 12A, on the auxiliary structure 41A and on the second lower electrode 12B, and, moreover, the upper electrode 16 is formed on the sacrificial film 21.

Meanwhile, the auxiliary structure 41A is formed between the first lower electrode 12A and the second lower electrode 12B. The height of the upper surface of the auxiliary structure 41A is higher than the height of the upper surfaces of the lower electrodes 12A and 12B. Hence, the sacrificial film 21 between the first lower electrode 12A and the second lower electrode 12B adopts a structure bulging in an upward direction. That is, the upper surface of the sacrificial film 21 bulges upward. Therefore, the upper electrode 16 formed on this sacrificial film 21 is also formed to bulge upward. That is, the lower surface of the upper electrode 16 between the first lower electrode 12A and the second lower electrode 12B bulges upward.

When the sacrificial film 21 and the auxiliary structure 41A are removed from the MEMS adopting the structure illustrated in FIG. 11A, the upper electrode 16 is kept bulged upward without being dented toward the substrate 10 as illustrated in FIG. 11B.

When the upper electrode 16 of the MEMS adopting the structure illustrated in FIG. 11B is driven, the upper electrode 16 descends toward the lower electrodes 12A and 12B, and the upper electrode 16 contacts the insulating films 15 on the lower electrodes 12A and 12B as illustrated in FIG. 11C. In this case, the upper electrode 16 between the first lower electrode 12A and the second lower electrode 12B bulges upward, that is, the lower surface of the upper electrode 16 bulges in an upward direction. Hence, part of the upper electrode 16 does not contact the ends of the lower electrodes before the upper electrode 16 contacts the insulating film 15, no cavity is produced between the insulating film 15 on the lower electrodes 12A and 12B and the upper electrode 16. Consequently, when the upper electrode is driven toward the lower electrodes in the MEMS capacitor, an unnecessary gap is not produced between the upper electrode and the lower electrodes, so that it is possible to secure a sufficient capacitance.

Further, the upper electrode 16 does not include the curved portion, and the curved portion of the upper electrode 16 does not contact the end portions of the lower electrodes, and serve as a pivot and prevent the upper electrode 16 from being driven. Consequently, problems do not occur that a high voltage is required to sufficiently attach closely the upper electrode 16 and the lower electrodes, that is, sufficiently saturate the capacitance, and that, when the voltage to be applied between the upper electrode and the lower electrodes is increased, the contact portion serves as a pivot and changes a cavity between the upper and lower electrodes.

Next, a structure near the lower electrode 12B and a modified example of its manufacturing method will be described with reference to FIGS. 12A, 12B and 12C.

Figure 12A:
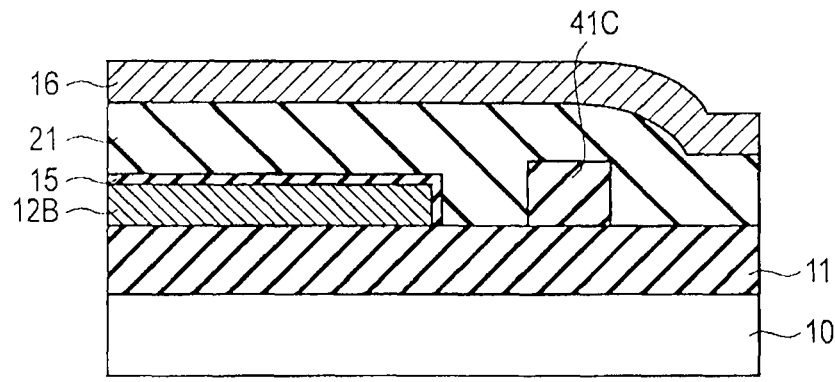
FIGS. 12A to 12C are sectional views near an end of a lower electrode according to a modified example of the third embodiment.
Figure 12B:
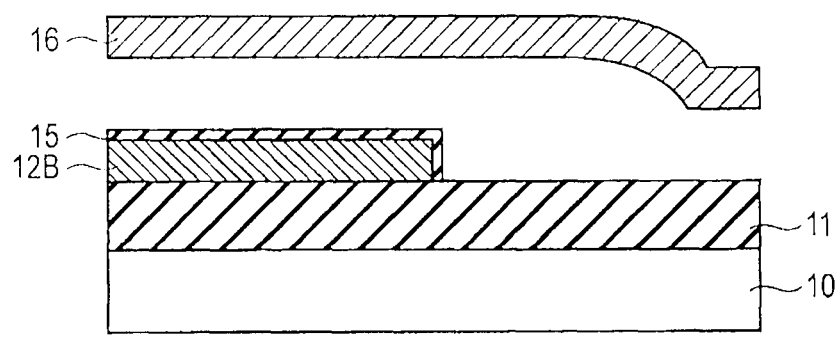
Figure 12C:
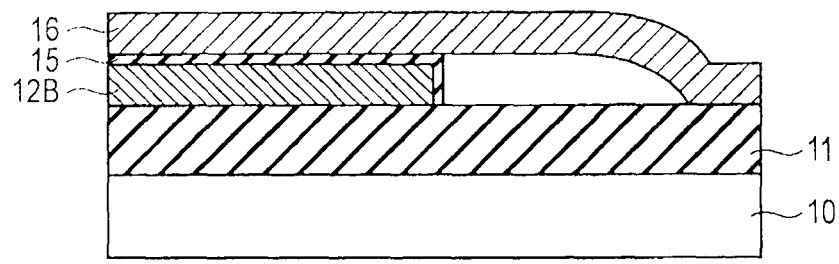

FIGS. 12A, 12B and 12C are views illustrating a sectional structure near the end of the second lower electrode 12B of the MEMS. FIG. 12A illustrates a cross section after the sacrificial film 21 and the upper electrode 16 are formed on the second lower electrode 12B and the auxiliary structure 41C. FIG. 12B illustrates a cross section after the sacrificial film 21 and the auxiliary structure 41C are removed. FIG. 12C illustrates a cross section when the upper electrode 16 is driven, and the upper electrode 16 contacts the insulating films 15 on the second lower electrode 12B.

Although the height of the upper surface of the auxiliary structure 41C is the same height as the height of the upper surface of the lower electrode 12B in FIG. 10A, the height of the upper surface of the auxiliary structure 41C is higher than the height of the upper surface of the lower electrode 12B in FIGS. 12A, 12B and 12C.

As illustrated in FIG. 12A, the sacrificial film 21 is formed on the second lower electrode 12B and on the auxiliary structure 41C, and, moreover, the upper electrode 16 is formed on the sacrificial film 21.

Meanwhile, in the surrounding of the second lower electrode 12B, the auxiliary structure 41C is provided adjacent to the second lower electrode 12B. The upper surface of the auxiliary structure 41C is formed higher than the upper surface of the second lower electrode 12B. Hence, the sacrificial film 21 above the vicinity of the second lower electrode 12B (auxiliary structure 41C) is flattened without being dented. That is, the upper surface of the sacrificial film 21 is formed flat. Consequently, the upper electrode 16 formed on this sacrificial film 21 is flattened without being dented downward (toward the substrate 10). That is, the lower surface of the upper electrode 16 formed near the end of the second lower electrode 12B is formed flat without descending toward the substrate 10.

When the sacrificial film 21 and the auxiliary structure 41C are removed in the MEMS adopting the structure illustrated in FIG. 12A, the upper electrode 16 near the end of the second lower electrode 12B is kept flat without being dented toward the substrate 10 as illustrated in FIG. 12B.

When the upper electrode 16 of the MEMS adopting the structure illustrated in FIG. 12B is driven, the upper electrode 16 descends toward the lower electrode 12B and the upper electrode 16 contacts the insulating films 15 on the lower electrode 12B as illustrated in FIG. 12C. In this case, the upper electrode 16 near the end of the second lower electrode 12B is not dented or curved toward the substrate 10 (toward the lower electrodes), so that the upper electrode 16 does not include a curved portion, a problem does not occur that the curved portion contacts the end of the lower electrode 12A, and a gap is not produced between the insulating film 15 on the lower electrode 12B and the upper electrode 16. Consequently, when the upper electrode is driven toward the lower electrodes in the MEMS capacitor, an unnecessary gap is not produced between the upper electrode and the lower electrodes, so that it is possible to secure a sufficient capacitance.

Further, as described above, the upper electrode 16 near the end of the lower electrode 12B does not include the curved portion, and the curved portion of the upper electrode 16 does not contact the end portions of the lower electrodes, and serve as a pivot and prevent the upper electrode 16 from being driven. Consequently, problems do not occur that a high voltage is required to sufficiently attach closely the upper electrode 16 and the lower electrodes, that is, sufficiently saturate the capacitance, and that, when the voltage to be applied between the upper electrode and the lower electrodes is increased, a contact portion serves as a pivot and changes a cavity between the upper and lower electrodes.

4. Modified Example

Auxiliary structures arranged in the surrounding of ends of lower electrodes may employ the following configuration.

FIG. 13A is a planar view illustrating a structure of a MEMS according to a first modified example. FIG. 13B is a sectional view along a 13B-13B line in FIG. 13A.

As illustrated in FIGS. 13A and 13B, a lower electrode 12A, auxiliary structures 13A and 13B and a interconnection layer 14 are formed on an insulating film 11 on a support substrate 10. The auxiliary structure 13A and the auxiliary structure 13B are arranged adjacent to the lower electrode 12A to sandwich the first lower electrode 12A.

The auxiliary structure 13A and the auxiliary structure 13B are placed in a floating state where these electrodes are insulated from the lower electrode 12A and the interconnection layer 14, and are electrically insulated from other signal, driving, power source or reference voltage electrodes. The auxiliary structures 13A and 13B may be made of the same material as the lower electrode 12A and the interconnection layer 14, or may be made of a different conductive material or an insulating film.

The lower electrode 12A, the upper electrode 16 and the insulating films 15 between the lower electrode 12A and the upper electrode 16 form a variable capacitance element. When the electrostatic force produced between a lower electrode of a driving electrode and the upper electrode 16 drives the upper electrode 16, the upper electrode 16 descends in a downward direction (toward the lower electrode), and the upper electrode 16 contacts an insulating film 15 on the lower electrode 12A. By this means, it is possible to vary the capacitance of the variable capacitance element. The other configurations and effect are the same as the above-described first embodiment.

FIG. 14A is a planar view illustrating a structure of a MEMS according to a second modified example. FIG. 14B is a sectional view along a 14B-14B line in FIG. 14A.

As illustrated in FIGS. 14A and 14B, a lower electrode 12A, an auxiliary structure 13D and a interconnection layer 14 are formed on an insulating film 11 on a support substrate 10. The auxiliary structure 13D is arranged adjacent to the lower electrode 12A to surround the first lower electrode 12A.

The auxiliary structure 13D is placed in a floating state where this electrode is insulated from the lower electrode 12A and the interconnection layer 14, and is electrically insulated from other signal, driving, power source or reference voltage electrodes. The auxiliary structure 13D may be made of the same material as the lower electrode 12A and the interconnection layer 14, or may be made of a different conductive material or an insulating film.

The lower electrode 12A, the upper electrode 16 and the insulating films 15 between the lower electrode 12A and the upper electrode 16 form a variable capacitance element. When the electrostatic force produced between a lower electrode of a driving electrode and the upper electrode 16 drives the upper electrode 16, the upper electrode 16 descends in a downward direction (toward the lower electrode), and the upper electrode 16 contacts an insulating film 15 on the lower electrode 12A. By this means, it is possible to vary the capacitance of the variable capacitance element.

With this modified example, the auxiliary structure 13D is arranged adjacent to the lower electrode 12A to surround the first lower electrode 12A. That is, the lower electrode 12A has a rectangular shape, and the auxiliary structure 13D is provided to surround three side directions of the lower electrode 12A. Hence, it is possible to prevent the upper electrode 16 formed around the lower electrode 12A from being dented or curved in the downward direction. Thus, there is no curved portion, so that a problem which occurs when there is a curved portion can be overcome that a gap between the insulating film 15 on the lower electrode 12A and the upper electrode 16 or a contact portion between the curved portion and an end of a lower electrode serves a pivot and changes a gap between the lower electrode and the upper electrode. The other configurations and effect are the same as the above-described first embodiment.

FIG. 15A is a planar view illustrating a structure of a MEMS according to a third modified example. FIG. 15B is a sectional view along a 15B-15B line in FIG. 15A.

As illustrated in FIGS. 15A and 15B, a lower electrode 12A, auxiliary structures 13E and 13F and a interconnection layer 14 are formed on an insulating film 11 on a support substrate 10. The auxiliary structures 13E have a plurality of island patterns, and these island patterns are arranged adjacent to the lower electrode 12A to surround the lower electrode 12A. Further, the auxiliary structures 13E also have a plurality of island patterns, and these island patterns are aligned adjacent to the auxiliary structure 13E and closer to a connection beam 19 side.

The auxiliary structures 13E and 13F are placed in a floating state where these electrodes are insulated from the lower electrode 12A and the interconnection layer 14, and is electrically insulated from other signal, driving, power source or reference voltage electrodes. The auxiliary structures 13E and 13F may be made of the same material as the lower electrode 12A and the interconnection layer 14, or may be made of a different conductive material or an insulating film.

The lower electrode 12A, the upper electrode 16 and the insulating films 15 between the lower electrode 12A and the upper electrode 16 form a variable capacitance element. When the electrostatic force produced between a lower electrode of a driving electrode and the upper electrode 16 drives the upper electrode 16, the upper electrode 16 descends in a downward direction (toward the lower electrode), and the upper electrode 16 contacts an insulating film 15 on the lower electrode 12A. By this means, it is possible to vary the capacitance of the variable capacitance element.

With this modified example, a plurality of auxiliary structures 13E are arranged adjacent to the lower electrode 12A to surround the lower electrode 12A, and a plurality of auxiliary structures 13F are further aligned on an outer side of the auxiliary structures 13E. That is, the lower electrode 12A has a rectangular shape, and a plurality of auxiliary structures 13E are provided to surround three side directions of the lower electrode 12A. Further, a plurality of auxiliary structures 13F are further disposed closer to an anchor 20 of the auxiliary structures 13E. Hence, with this modified example, it is possible to prevent the upper electrode 16 formed on the auxiliary structures 13E and 13F from being dented or curved in the downward direction. Thus, there is no curved portion, so that a problem which occurs when there is a curved portion can be overcome that a gap between the insulating film 15 on the lower electrode 12A and the upper electrode 16 or a contact portion between the curved portion and an end of a lower electrode serves a pivot and changes a gap between the upper and lower electrodes. The other configurations and effect are the same as the above-described first embodiment.

In addition, the above-described method of manufacturing a MEMS is an example, and does not particularly limit the present embodiments. For example, support beams for an upper electrode may be formed together with the upper electrode using the same material as the upper electrode, or may be formed using a different material. Further, although, with the embodiments, a scheme is adopted of performing driving using the electrostatic force by applying the voltage between upper and lower electrodes, the embodiments are applicable to a MEMS structure having a scheme of forming electrodes using different types of layered metals and performing driving using a piezoelectric force.

The MEMS according to the embodiments is applicable not only to the variable capacitance element, but also to a switch. When the MEMS is applied to a switch, part of a capacitor insulating film formed on a lower electrode such as an insulating film contacting an upper signal electrode is removed by patterning and etching to expose the surface of the lower electrode. By this means, a switch formed of the upper electrode and the lower electrode is formed, and is operated when upper and lower driving electrodes drive the upper electrode.

Although a structure is adopted with the embodiments which has two types of electrodes of a movable upper electrode and fixed lower electrodes, the embodiments are applicable even when both of the upper electrode and the lower electrode are movable. Further, the embodiments are also applicable to a MEMS included three or more electrodes (for example, a fixed upper electrode, a fixed lower electrode and a movable middle electrode).

The sizes of the lower electrode and the upper electrode can be designed freely based on a required electrostatic capacitance. Further, a MEMS structure can also be formed on a transistor circuit such as a CMOS. Further, it is also possible to form a dorm structure for protecting a MEMS.

As described above, according to the embodiments, it is possible to provide a MEMS and a method of manufacturing a MEMO which can provide good element characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A micro-electro-mechanical system (MEMS) comprising:
   a first electrode provided on a substrate;
   a first auxiliary structure provided on the substrate and adjacent to the first electrode, and being in an electrically floating state; and
   a second electrode provided above the first electrode and the first auxiliary structure, and being driven in a direction of the first electrode,
   wherein a lower surface of the second electrode which is located above an outside of an outer end of the first auxiliary structure has a curved portion, and
   the first auxiliary structure is arranged to surround the first electrode.

2. The MEMS according to claim 1, wherein the first auxiliary structure is arranged near an area in which the first electrode faces the second electrode.

3. The MEMS according to claim 1, further comprising a third electrode provided on the substrate such that the first auxiliary structure is sandwiched between the third electrode and the first electrode.

4. The MEMS according to claim 3, wherein the second electrode bulges at a portion between the first electrode and the third electrode toward a side opposite to the first and third electrodes.

5. The MEMS according to claim 3, further comprising a third auxiliary structure provided on the substrate such that the third electrode is sandwiched between the third auxiliary structure and the first auxiliary structure.

6. The MEMS according to claim 1, further comprising a second auxiliary structure provided on the substrate such that the first electrode is sandwiched between the second auxiliary structure and the first auxiliary structure.

7. The MEMS according to claim 1, wherein the first auxiliary structure includes a plurality of island patterns.

8. The MEMS according to claim 1, wherein the second electrode is arranged above the first electrode and the first auxiliary structure across a cavity.

9. The MEMS according to claim 1, further comprising an insulating film provided between the first electrode and the first auxiliary structure, and the second electrode.

10. The MEMS according to claim 9, wherein the first electrode, the second electrode and the insulating film form a variable capacitance element.

11. The MEMS according to claim 1, further comprising a support beam provided above the first electrode and the first auxiliary structure, and holding the second electrode.

12. The MEMS according to claim 1, wherein the first auxiliary structure is made of a same material as the first electrode.

13. The MEMS according to claim 1, wherein the first auxiliary structure is made of a material different from the first electrode.

14. The MEMS according to claim 1, wherein the first and second electrodes and the first auxiliary structure are made of one of aluminum and tungsten.

15. A micro-electro-mechanical system (MEMS) comprising:
   a first electrode provided on a substrate;
   a first auxiliary structure provided on the substrate and adjacent to the first electrode, and being in an electrically floating state; and
   a second electrode provided above the first electrode and the first auxiliary structure, and being driven in a direction of the first electrode,
   wherein the first auxiliary structure is provided to prevent the second electrode from deforming, and
   the first auxiliary structure is arranged to surround three sides of the first electrode.

16. The MEMS according to claim 15, wherein the first auxiliary structure is provided to form an lower surface of the second electrode flat between the first electrode and the first auxiliary structure.

17. The MEMS according to claim 15, further comprising a sole connection beam connected to one end of the third electrode for an electrical connection.

18. The MEMS according to claim 1, farther comprising a third electrode provided on the substrate such that the first auxiliary structure is sandwiched between the third electrode and the first electrode, and a second auxiliary structure provided on the substrate such that the third electrode is sandwiched between the second auxiliary structure and the first auxiliary structure.

* * * * *